Nov. 30, 1965 W. B. HAUER 3,221,277

TUNNEL DIODE DEVICE

Filed Aug. 17, 1961

INVENTOR.
WALTER B. HAUER

BY Theodore Jay Jr.

ATTORNEY

United States Patent Office 3,221,277
Patented Nov. 30, 1965

3,221,277
TUNNEL DIODE DEVICE

Walter B. Hauer, Roslyn Heights, N.Y., assignor to General Telephone and Electronics Laboratories, Inc., Roslyn Heights, N.Y., a corporation of Delaware Filed Aug. 17, 1961, Ser. No. 132,061
5 Claims. (Cl. 333—83)

My invention relates to tunnel diode devices.

A tunnel diode comprises a narrow, highly doped semiconductor p-n junction having first and second electrodes secured to opposite sides of the junction. When a voltage of selected polarity falling within a selected range of values is applied between the two electrodes, some of the majority charge carriers travel (or "tunnel") from one side of the junction to the other at speed approaching the speed of light. As a result of the tunnelling action, the diode exhibits a voltage-controlled negative conductance. This combination of high tunnelling speed and controlled negative conductance permits the tunnel diode to be used as an oscillator, mixer, or an amplifier at microwave frequencies.

Tunnel diodes, depending upon the frequency of operation, are normally connected to wave guides, cavities, transmission lines, lumped circuits or combinations thereof. Under these conditions, the output signal from the diode takes the form of electromagnetic waves which propagate with different field patterns. Each of these patterns represents a separate mode. Several modes can exist simultaneously within the circuit structure employed.

In order to make optimum use of the output signal, the circuit containing the tunnel diode is designed to produce only that signal mode (for the frequency desired) at which the effective circuit inductance is minimized (otherwise maximum power output cannot be obtained). Consequently, the circuit and the diode are designed to minimize the effective inductance. Under these conditions, however, known tunnel diode circuits such as oscillators operating in a selected mode at a selected frequency tend to oscillate not only in this mode but also to oscillate simultaneously in one or more other modes at lower signal frequencies. These other modes are known as lower modes since the signal frequencies involved are approximate subharmonics of the selected frequency. As a result, the oscillator output power at the desired frequency is being strongly reduced due to power losses in one or more lower modes. Moreover, the frequency stability of the oscillator is impaired by multimode operation. Known tunnel diode amplifiers operating at microwave frequencies will not only amplify but will also tend to oscillate in lower modes in an undesired and unpredictable manner and thus become unstable.

I have succeeded in producing tunnel diode devices which overcome these difficulties.

Accordingly it is an object of my invention to suppress lower mode oscillations in tunnel diode devices.

Another object is to increase the output power of tunnel diode devices.

Still another object is to suppress lower mode oscillations and also increase the output power of tunnel diode devices.

Yet another object is to improve the stability of tunnel diode devices.

A further object is to provide a new and improved tunnel diode package incorporating means for suppressing lower mode oscillations.

Still a further object is to provide a tunnel diode package containing a damping resistor integral with the remainder of the package.

In accordance with the principles of my invention, a tunnel diode package is positioned within a microwave cavity. The circuit is designed to produce an output signal of selected frequency and wavelength. The distance between the package and the periphery of the cavity is approximately equal to one half this wavelength. Under these conditions, output signals are produced not only at the selected frequency but also at lower frequency modes.

These lower modes are suppressed by incorporating a damping resistance into the diode package.

This suppression occurs in the following manner. The output signal establishes standing waves of different frequencies within the cavity. More particularly, these waves are produced not only at the selected frequency but also at lower frequencies which approximately represent one or more subharmonics of the selected frequency. All these waves, regardless of frequency, have a common voltage node or point of minimum voltage coincident with the periphery of the cavity. However, the standing waves at the selected frequency have a voltage node substantially coincident with the diode package; the standing waves at the lower mode frequency or frequencies have a voltage anti-node (or point of maximum voltage) substantially coincident with the diode package. When a damping resistance is incorporated into the tunnel diode package, this resistance effectively short-circuits these lower mode waves and suppresses them. At the same time, however, this resistance has substantially no effect on the signal at the selected frequency.

As a result, the output power loss of the diode package at lower modes is substantially eliminated; both the power output at the selected frequency and the frequency stability are sharply enhanced.

The tunnel diode package comprises first and second electrodes secured to opposite ends of a hollow electrically non-conductive cylinder. The highly doped p-n junction is positioned within the cylinder, one side of the junction being electrically connected to one electrode, the other side of the junction being electrically connected to the other electrode. The damping resistance is in the form of at least one resistance film, strip or layer supported on the outer or inner surface of the non-conductive cylinder and extending between the first and second electrodes.

Illustrative embodiments of my invention will now be described with reference to the accompanying drawings wherein.

Figure 1:
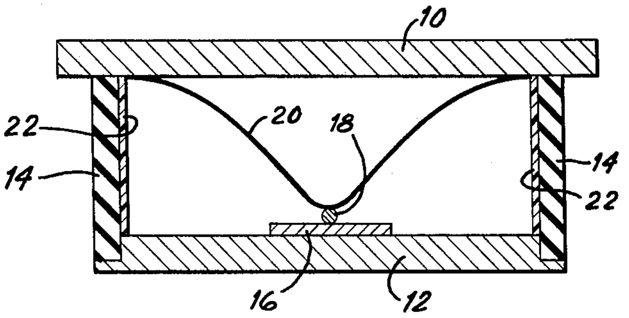
FIG. 1 is a cross sectional view of a tunnel diode package in accordance with the invention.

Referring now to FIG. 1, a tunnel diode package in accordance with the invention comprises a hollow ceramic electrically non-conductive cylinder 14 subtended between top and bottom electrically conductive metal electrodes 10 and 12. A semiconductor wafer 16 centrally positioned within cylinder 14 is secured to the top surface of the bottom electrode 12. A metallic dot 18 is alloyed with the wafer 16. A metal band 20 provides electrical contact between the dot 18 and the top electrode 10 as well as providing a physical supporting structure. (The package thus far described is disclosed in more detail in Patent 3,030,557 granted to George Dermit on April 17, 1962.)

One or more electrically resistive films or layers 22 are secured to the inner surface of cylinder 14 and extend between the top and bottom electrodes 10 and 12. Alternatively the film or films can be secured to the outer surface of cylinder 14. The film functions as a damping resistance as will be explained below.

The power output of tunnel diode devices such as oscillators in the microwave region is limited by the total circuit inductance L, the total series resistance $R_s$ and the $G/C$ ratio, where G is the absolute value of the negative conductance and C is the capacitance of the diode junction. Presently known tunnel diodes yield output power of the order of microwatts at frequencies of about 1 kilomegacycle per second and above. The presently available values of series resistance and $G/C$ ratio are such that the total circuit inductance limits the output power. More particularly, the output power could be increased to the order of milliwatts if the total circuit inductance could be sufficiently reduced.

Figures 2, 3:
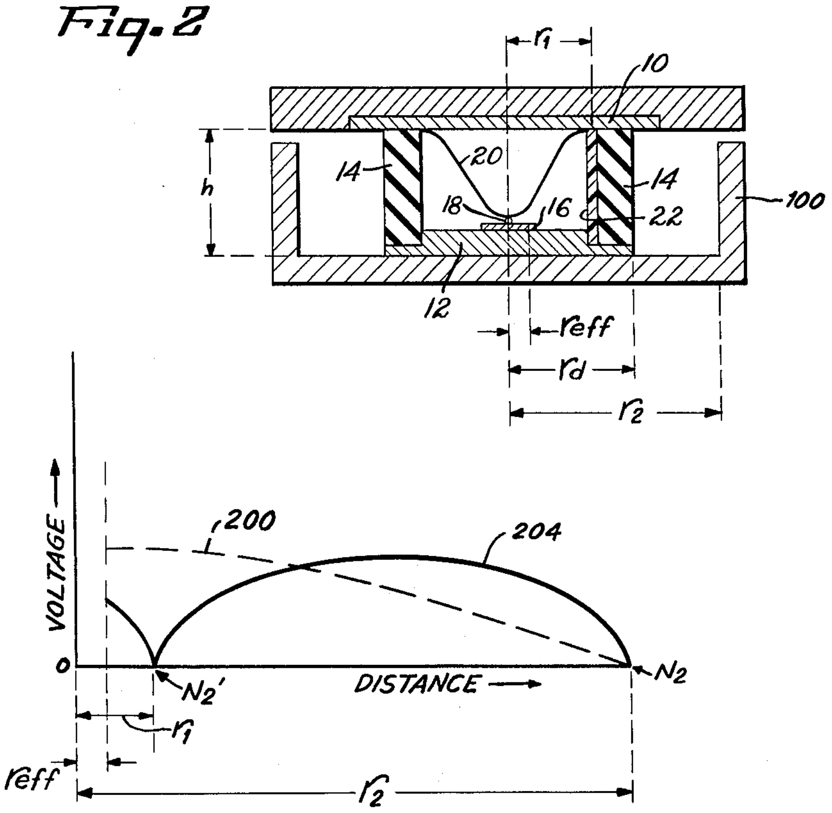
FIG. 2 is a cross sectional view of a microwave cavity containing the tunnel diode of FIG. 1.
FIG. 3 is a graph of various standing wave patterns established in the device of FIG. 2.

When a cylindrical tunnel diode package is placed into a cylindrical microwave cavity 100 (as shown in FIG. 2), it is found that the total circuit inductance L is defined by the equation $$L=4.6h\log_{10}\frac{r_2}{r_{eff}}$$

wherein $h$ is the height of the cavity, $r_2$ is the radius of the cavity measured to the inner wall thereof, and $r_{eff}$ is the effective radius of the tunnel diode. The effective radius is a dimension which takes into account the radial nonuniformity of the current path through the diode. It is determined for a given tunnel diode by placing the diode into a cavity of known dimensions $h$ and $r_2$, measuring the circuit inductance L, and then calculating $r_{eff}$ from the above equation. As the radius and height of the cavity are reduced, the inductance is reduced. However, the cavity radius cannot be made smaller than $r_d$, the actual radius of the package. Consequently, the minimum inductance available under these conditions is defined by $$L_{min}=4.6h\log_{10}\frac{r_d}{r_{eff}}$$

However, if the radius of the cavity is increased to be equal to approximately one half the wavelength of the frequency selected for the output signal, and the oscillator is supplied with power, it will be found that the cavity functions as a radial transmission line shorted at radius $r_2$. Under these conditions standing voltage waves are obtained. In particular, as shown in FIG. 3, two standing wave patterns can be obtained. The first pattern 204 represents the signal frequency desired and has a second voltage node of $N_2'$ in addition to the node at $N_2$. The radial distance $r_1$ from the center of the cavity to the second node $N_2'$ is equal to the radius $r_1$ and can be made smaller than the diode package radius $r_d$. When the oscillator is designed to utilize the pattern 204, the effective circuit inductance is then defined by $$L=4.6h\log\frac{r_1}{r_{eff}}$$

and is thus substantially smaller than the inductance obtained for a minimum size cavity. This arrangement provides increased output power. However, under the conditions as above, the oscillator can simultaneously oscillate not only at the selected frequency, but also at a lower mode using a circuit inductance determined by $r_2$ corresponding to the voltage pattern 200 in FIG. 3. As has been indicated previously, the oscillator output power at the desired frequency is sharply reduced due to power losses in lower modes and further the oscillation stability is impaired.

The damping resistance $R_1$ in the tunnel diode package (i.e., film 22 in FIGS. 1 and 2) by virtue of its location in the diode package, is positioned in coincidence with the second node $N_2'$ of FIG. 3. Under these conditions, the damping resistance short-circuits the pattern 200 of FIG. 3; i.e., it suppresses the lower mode. At the desired frequency, however, since the damping resistance $R_1$ is positioned at the second node $N_2'$, no voltage appears across the damping resistance, and so the signal at the selected frequency is not impaired.

A tunnel diode oscillator in accordance with the invention has yielded 1.7 milliwatts of output power at a frequency of 3 kilomegacycles per second. Under these conditions, the resistive film, in the form of a thin line of silver paint, was found to have a value falling within the range 12–15 ohms. With the resistive film cut out of the circuit, a lower mode having a frequency of between 300 to 500 megacycles per second was produced and the output power was reduced to about 1/10 or 1/20 of its previous value.

What is claimed is:

1. A tunnel diode device comprising a hollow resonator having metallic walls, said resonator being tuned to a signal having a selected wavelength; and a hollow diode package disposed within said resonator, said package including a tunnel diode package comprising a hollow electrically non-conductive cylinder open at both ends; first and second electrodes secured to and sealing off opposite ends of said cylinder, said first and second electrodes being electrically connected to opposite walls respectively of said resonator; a narrow, highly doped p-n junction formed by a semiconductor wafer having a metallic dot alloyed thereto positioned within said cylinder, said semiconductor wafer being electrically connected to said first electrode, and said metallic dot being electrically connected to said second electrode; and a damping resistor supported by said cylinder and electrically connected between said first and second electrodes, the distance between said damping resistor and the metallic walls of said resonator being approximately equal to one-half wavelength.

2. A tunnel diode device comprising a cavity having metallic walls, said cavity being tuned to a microwave signal having a selected wavelength; a tunnel diode package centrally disposed within said cavity, said package including a tunnel diode package comprising a hollow electrically non-conductive cylinder open at both ends; first and second electrodes secured to and sealing off opposite ends of said cylinder, said first and second electrodes being electrically connected to opposite walls respectively of said cavity; a narrow, highly doped p-n junction formed by a semiconductor wafer having a metallic dot alloyed thereto positioned within said cylinder, said semiconductor wafer being electrically connected to said first electrode, and said metallic dot being electrically connected to said second electrode; and a damping resistor supported by said cylinder and electrically connected between said first and second electrodes, the distance between said damping resistor and the metallic walls of said cavity being approximately equal to one half wavelength.

3. A tunnel diode package for mounting within a cavity tuned to a signal having a selected wavelength, said package comprising a hollow electrically non-conductive enclosure open at both ends; first and second electrodes secured to and sealing off opposite ends of said enclosure, said first and second electrodes being electrically connected to opposite walls of said cavity; a narrow, highly doped p-n junction formed by a semiconductor wafer having a metallic dot alloyed thereto positioned within said enclosure, said semiconductor wafer being electrically connected to said first electrode and the metallic dot being electrically connected to said second electrode; and at least one resistance film secured to said enclosure and electrically connected between said first and second electrodes, the distance between said resistance film and the periphery of said cavity being approximately equal to one half of said selected wavelength.

4. A tunnel diode package for mounting within a cavity tuned to a signal having a selected wavelength, said package comprising a hollow electrically non-conductive cylindrical enclosure open at both ends; first and second electrodes secured to and sealing off opposite ends of said enclosure, said first and second electrodes being electrically connected to opposite walls of said cavity; a narrow, highly doped p-n junction formed by a semiconductor wafer having a metallic dot alloyed thereto positioned within said enclosure, said semiconductor wafer being electrically connected to said first electrode and the metallic dot being electrically connected to said second electrode; and a resistance film secured to the inner wall of said enclosure and electrically connected between said first and second electrodes, the distance between said resistance film and the periphery of said cavity being approximately equal to one half of said selected wavelength.

5. A tunnel diode package for mounting within a cavity tuned to a signal having a selected wavelength, said package comprising a hollow electrically non-conductive cylindrical enclosure open at both ends; first and second electrodes secured to and sealing off opposite ends of said enclosure, said first and second electrodes being electrically connected to opposite walls of said cavity; a narrow, highly doped p-n junction formed by a semiconductor wafer having a metallic dot alloyed thereto positioned within said enclosure, said semiconductor wafer being electrically connected to said first electrode and the metallic dot being electrically connected to said second electrode; and a resistance film secured to the inner wall of said enclosure and electrically connected between said first and second electrodes, said film being composed of silver paint, the distance between said resistance film and the periphery of said cavity being approximately equal to one half of said selected wavelength.

References Cited by the Examiner

UNITED STATES PATENTS

| | | | |
|---|---|---|---|
| 2,781,480 | 2/1957 | Mueller | 317—235 X |
| 3,034,079 | 5/1962 | Uhlir | 317—234 X |
| 3,051,908 | 8/1962 | Anderson et al. | 333—81 X |

JOHN W. HUCKERT, *Primary Examiner.*

JAMES D. KALLAM, *Examiner.*